(12) United States Patent
Lin et al.

(10) Patent No.: US 12,289,866 B2
(45) Date of Patent: Apr. 29, 2025

(54) GRAPHICS CARD AND COMPUTER HOST

(71) Applicant: Acer Incorporated, New Taipei (TW)

(72) Inventors: Yu-Ming Lin, New Taipei (TW);
Wen-Neng Liao, New Taipei (TW);
Cheng-Wen Hsieh, New Taipei (TW);
Shu-Hao Kuo, New Taipei (TW);
Tsung-Ting Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 144 days.

(21) Appl. No.: 18/297,662

(22) Filed: Apr. 10, 2023

(65) Prior Publication Data

US 2023/0328930 A1    Oct. 12, 2023

(30) Foreign Application Priority Data

Apr. 11, 2022    (TW) .................................. 111113637

(51) Int. Cl.
*H05K 7/20* (2006.01)
*G06F 1/18* (2006.01)
*G06F 1/20* (2006.01)

(52) U.S. Cl.
CPC ......... *H05K 7/20409* (2013.01); *G06F 1/185* (2013.01); *G06F 1/20* (2013.01); *H05K 7/20172* (2013.01)

(58) Field of Classification Search
CPC ...... G06F 1/20; G06F 1/203; G06F 2200/201; G06F 1/206; G06F 1/186; G06F 1/185;

(Continued)

(56) References Cited

U.S. PATENT DOCUMENTS 6,712,129 B1 *   3/2004  Lee ....................... H01L 23/427
                                                                   174/15.2
6,795,315 B1 *   9/2004  Wu ....................... H01L 23/467
                                                                   174/16.3

(Continued)

FOREIGN PATENT DOCUMENTS

| TW | I318097 | 12/2009 |
|---|---|---|
| TW | I401563 | 7/2013 |
| TW | M472230 | 2/2014 |

OTHER PUBLICATIONS

Lee et al., Electronic apparatus with heat-dissipation structure, TW M426987 (Year: 2012).*

*Primary Examiner* — Michael A Matey
(74) *Attorney, Agent, or Firm* — JCIPRNET

(57) ABSTRACT

A graphics card including a circuit board module, a first heat dissipation fin, and a pair of fans is provided. The circuit board module includes a circuit board and a heat source. The circuit board has first to fourth sides surrounding the heat source. The first and second sides are opposite sides. The third and fourth sides are opposite sides. The first heat dissipation fin is in thermal contact with the heat source and has multiple channels communicating with the first to fourth sides. The fans disposed on the first and second sides respectively have first flow outlets facing the first heat dissipation fin and generate flows towards the first heat dissipation fin through the first flow outlets. The flows meet and squeeze in the channels to form turbulent flows and flow out of the graphics card through the third and fourth sides respectively. A computer host is also provided.

26 Claims, 8 Drawing Sheets

(58) Field of Classification Search
CPC ........... H05K 7/20154; H05K 7/20409; H05K 7/20172; H05K 7/20136; H05K 2201/066; H05K 7/1461; H05K 1/0203; F04D 29/281

See application file for complete search history.

(56) References Cited

U.S. PATENT DOCUMENTS

| | | | | |
|---|---|---|---|---|
| 8,934,235 B2* | 1/2015 | Rubenstein | ......... | F28D 15/0275 |
| | | | | 361/679.48 |
| 9,459,669 B2* | 10/2016 | Hrehor, Jr. | ............ | H01L 23/427 |
| 10,827,645 B2* | 11/2020 | Chen | ................. | H05K 7/20145 |
| 11,073,878 B2* | 7/2021 | Liu | .......................... | G06F 1/203 |
| 11,930,620 B2* | 3/2024 | Ku | .......................... | G06F 1/203 |
| 2004/0105233 A1* | 6/2004 | Lai | ........................ | H05K 7/202 |
| | | | | 361/695 |
| 2006/0196643 A1* | 9/2006 | Hata | ..................... | H01L 23/473 |
| | | | | 257/E23.098 |
| 2007/0121289 A1* | 5/2007 | Peng | ......................... | G06F 1/20 |
| | | | | 257/E23.099 |
| 2009/0059538 A1* | 3/2009 | Peng | ......................... | G06F 1/20 |
| | | | | 361/697 |
| 2013/0327507 A1* | 12/2013 | Degner | ................ | H05K 7/2039 |
| | | | | 361/695 |
| 2018/0203493 A1* | 7/2018 | Han | .................... | H05K 7/20209 |
| 2018/0295746 A1* | 10/2018 | Han | .................... | H05K 7/20409 |
| 2021/0079926 A1* | 3/2021 | He | ....................... | F04D 29/4246 |
| 2021/0149463 A1* | 5/2021 | Lu | ..................... | H05K 7/20154 |
| 2021/0317844 A1 | 10/2021 | Chen et al. | | |
| 2021/0321533 A1 | 10/2021 | Chen et al. | | |
| 2021/0349509 A1 | 11/2021 | Utz et al. | | |
| 2022/0179461 A1* | 6/2022 | North | .................... | G06F 1/1688 |
| 2022/0217870 A1* | 7/2022 | Columbus | ............ | H05K 7/1092 |
| 2022/0229477 A1* | 7/2022 | Chen | ........................ | G06F 1/203 |
| 2023/0328923 A1* | 10/2023 | Lee | .......................... | G06F 1/20 |
| 2023/0354554 A1* | 11/2023 | Lin | .................... | H05K 7/20172 |

* cited by examiner

GRAPHICS CARD AND COMPUTER HOST

CROSS-REFERENCE TO RELATED APPLICATION

This application claims the priority benefit of Taiwan application serial no. 111113637, filed on Apr. 11, 2022. The entirety of the above-mentioned patent application is hereby incorporated by reference herein and made a part of this specification.

BACKGROUND

Technical Field

The disclosure relates to a graphics card and a computer host.

Description of Related Art

The graphics card is one of the most basic components of a personal computer (PC), and it is used to convert the display information required by the computer host system to drive the computer, and to provide progressive or interlaced scanning signals to control the correct display of the computer. The graphics card is an important component of a PC motherboard, and is one of the important devices for "human-machine dialogue."

With the rapid development of science and technology, the current tasks of the graphics card further include functions such as three-dimensional image calculation and graphics acceleration in addition to providing display signals. However, as the workload of the graphics card becomes heavier and heavier, the heat generation of the graphics card becomes greater and greater, so various heat dissipation devices are also developed to meet the needs.

SUMMARY

The disclosure provides a graphics card, which provides opposing dual fans on opposite sides of a heat dissipation fin, so that the flows generated by the fans form turbulent flows at the heat dissipation fin to improve the heat dissipation efficiency.

The disclosure provides a computer host, which improves the heat dissipation performance by the dual fans and the heat dissipation fin of the graphics card.

A graphics card according to the disclosure includes a circuit board module, a first heat dissipation fin and a pair of fans. The circuit board module includes a circuit board and at least one heat source. The heat source is disposed on the circuit board. The circuit board has a first side, a third side, a second side and a fourth side surrounding the heat source in sequence. The first side and the second side are opposite to each other. The third side and the fourth side are opposite to each other. The first heat dissipation fin is in thermal contact with the heat source. The first heat dissipation fin has multiple channels communicating with the first side, the second side, the third side and the fourth side. The fans are disposed beside the heat source and located on the first side and the second side respectively. The fans each has a first flow outlet facing the first heat dissipation fin to generate flows flowing toward the first heat dissipation fin.

A computer host according to the disclosure includes a body, a motherboard and at least one graphics card. The motherboard is disposed in the body. The graphics card is inserted on the motherboard. The graphics card includes a circuit board module, a first heat dissipation fin and a pair of fans. The circuit board module includes a circuit board and at least one heat source. The heat source is disposed on the circuit board. The circuit board has a first side, a third side, a second side and a fourth side surrounding the heat source in sequence. The first side and the second side are opposite to each other. The third side and the fourth side are opposite to each other. The first heat dissipation fin is in thermal contact with the heat source. The first heat dissipation fin has multiple channels communicating with the first side, the second side, the third side and the fourth side. The fans are disposed beside the heat source and located on the first side and the second side respectively. The fans each has a first flow outlet facing the first heat dissipation fin to generate flows flowing toward the first heat dissipation fin.

Based on the above, in the graphics card and the computer host including the graphics card according to the disclosure, the graphics card includes the circuit board module, the heat dissipation fin and the pair of fans. The circuit board of the circuit board module has the first side, the second side, the third side and the fourth side surrounding the heat source. The fans are disposed on the first side and the second side, that is, on the opposite sides of the heat dissipation fin, and provide flows toward the heat dissipation fin respectively. The heat dissipation fin has multiple channels to communicate with the first side, the second side, the third side and the fourth side. Accordingly, the flows generated by the fans meet and squeeze in the channels to form turbulent flows. In this way, since the heat dissipation fin is provided with fans on two opposite sides, the heat transfer and heat dissipation paths can be shortened, and the turbulent flows formed in the channels can increase the contact frequency between the flows and the heat dissipation fin, thereby improving the heat dissipation efficiency.

DESCRIPTION OF EMBODIMENTS

Figure 1:
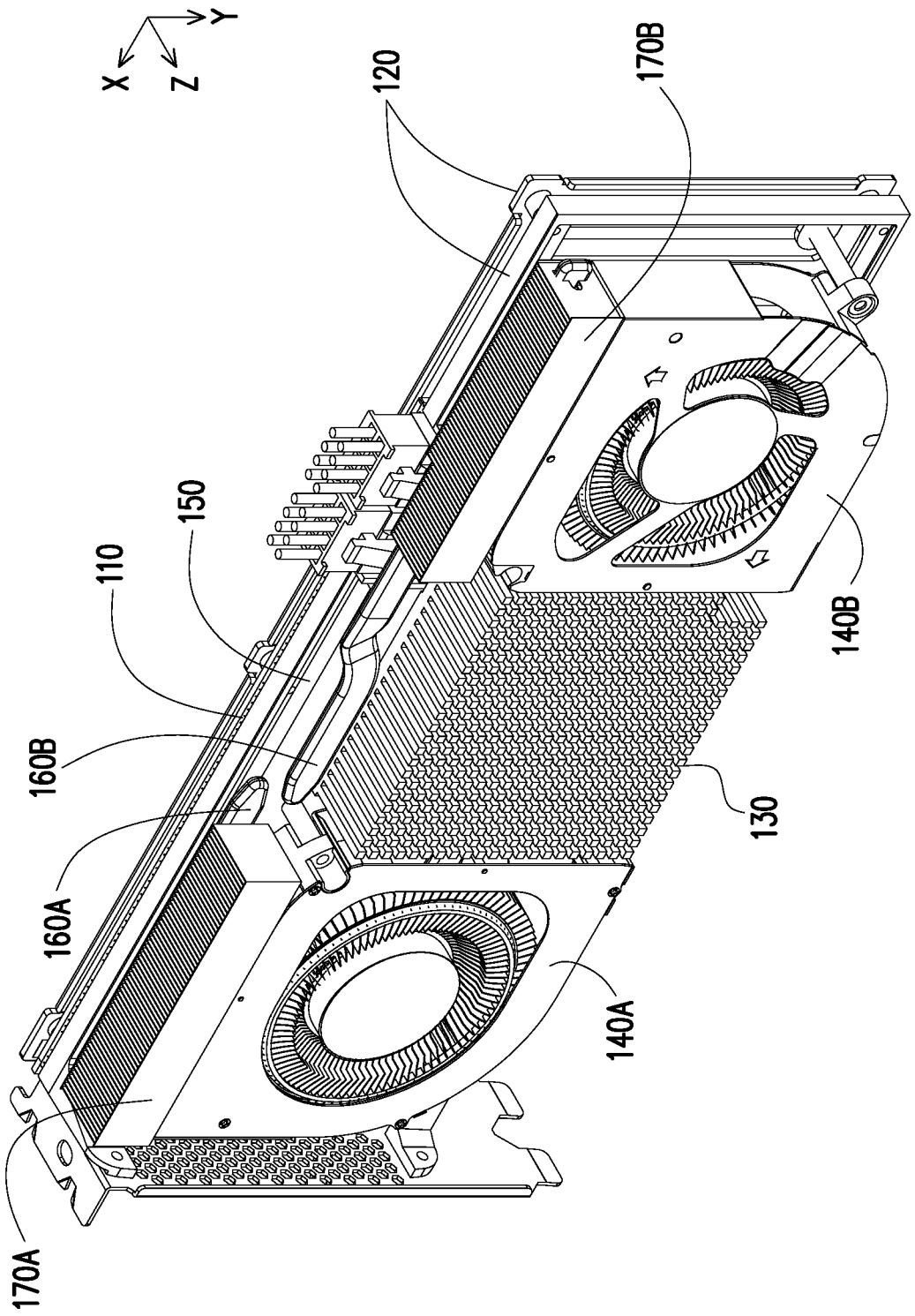
FIG. 1 is a schematic view of a graphics card according to an embodiment of the disclosure.
Figure 2:
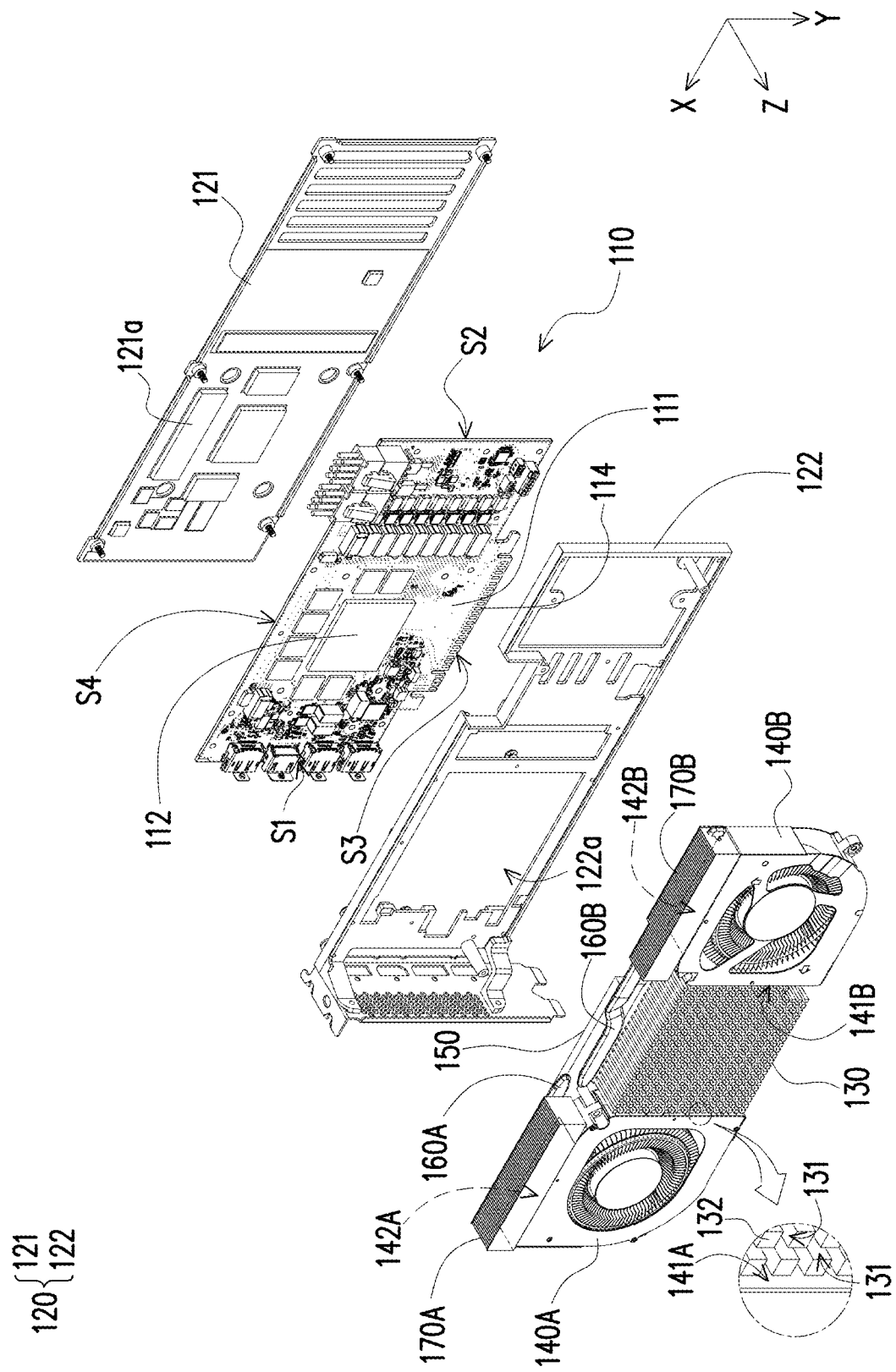
FIG. 2 is an exploded view of the graphics card of FIG. 1.
Figure 3:
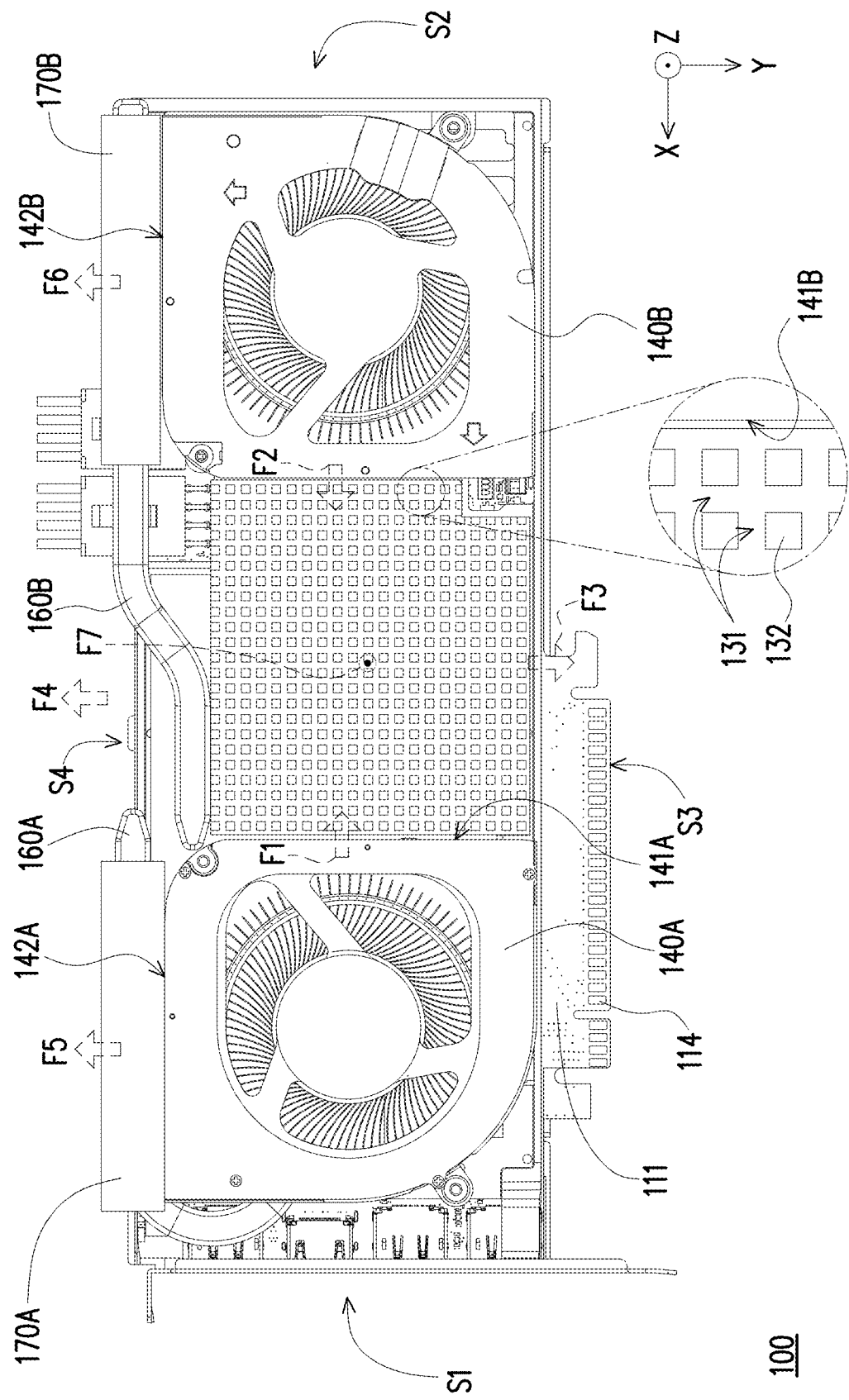
FIG. 3 is a front view of the graphics card of FIG. 1.

FIG. 1 is a schematic view of a graphics card according to an embodiment of the disclosure. FIG. 2 is an exploded view of the graphics card of FIG. 1. FIG. 3 is a front view of the graphics card of FIG. 1. Cartesian coordinates XYZ are provided here to facilitate component description. Please refer to FIG. 1 to FIG. 3 together. The graphics card 100 of this embodiment, especially a discrete graphics processing unit (dGPU) or a dedicated graphics card, is suitable for being installed on a board expansion slot of a motherboard of a desktop computer, and is connected to the motherboard through an expansion slot interface such as PCI Express, AGP or PCI, for example.

The graphics card 100 includes a circuit board module 110, a frame 120, a first heat dissipation fin 130, and a pair of fans 140A and 140B. As shown in FIG. 2, the frame 120 includes components 121 and 122. The circuit board module 110 is assembled between the components 121 and 122. The first heat dissipation fin 130 and the fans 140A and 140B are respectively assembled on the frame 120. The circuit board module 110 includes a circuit board 111 and a heat source 112. The heat source 112 is, for example, a GPU, which is mounted on the circuit board 111 and is in thermal contact with the first heat dissipation fin 130 through an opening 122a of the component 122. Meanwhile, the component 121 has multiple thermally conductive pads 121a for contacting the circuit board 111 or electronic components (not shown) thereon.

Furthermore, the circuit board 111 of this embodiment has a first side S1, a third side S3, a second side S2 and a fourth side S4 surrounding the heat source 112 in sequence. The first side S1 and the second side S2 are opposite to each other, and the third side S3 and the fourth side S4 are opposite to each other. The first heat dissipation fin 130 has multiple channels 131 communicating with the first side S1 and the second side S2, and with the third side S3 and the fourth side S4. The fans 140A and 140B are disposed beside the heat source 112 and located on the first side S1 and the second side S2 respectively. The fans 140A and 140B respectively have first flow outlets 141A and 141B facing the heat source 112 to generate flows F1 and F2 to flow toward the first heat dissipation fin 130 respectively. After the flows F1 and F2 meet and squeeze in the channels 131 to form turbulent flows, flows F3 and F4 are respectively formed to flow out of the graphics card 100 through the third side S3 and the fourth side S4. Here, four different orientations (the first side S1 to the fourth side S4) with respect to the circuit board 111 are defined with the circuit board 111 as a reference.

Further, the first heat dissipation fin 130 of this embodiment has multiple pillars 132 arranged in a matrix, and spacings between these pillars 132 form the channels 131. In this embodiment, the channels 131 are aligned parallel to the X axis and parallel to the Y axis, respectively. In another embodiment, the pillars 132 may be arranged in a staggered manner, so that the effect of forming turbulent flows is better. Meanwhile, the fans 140A and 140B of this embodiment are each a centrifugal fan, which has axial flow inlets disposed on the Z-axis, and respectively have first flow outlets 141A and 141B (radial flow outlets) facing the first heat dissipation fin 130. Since the fans 140A and 140B are located on the first side S1 and the second side S2, the two first flow outlets 141A and 141B are in a state of facing each other across the first heat dissipation fin 130.

In this way, when the fans 140A and 140B are running, the flows F1 and F2 respectively flow out from the first flow outlets 141A and 141B, and the flows F1 and F2 flow out to the channels 131 of the first heat dissipation fin 130. Therefore, after the flows F1 and F2 meet and squeeze in the channels 131 to form turbulent flows, the flows F3 and F4 are formed to flow out of the graphics card 100 through the third side S3 and the fourth side S4 respectively. Compared with graphics card using axial fans according to the conventional technology, the centrifugal fans are used in this embodiment, and a higher static pressure may be formed. Specifically, the fans 140A and 140B are disposed on opposite sides of the first heat dissipation fin 130, so the heat transfer path for the heat source 112 to dissipate heat to the first heat dissipation fin 130 is shortened; that is, the embodiment avoids disposing the fans on only one side of the heat dissipation fin, which results in poor heat dissipation efficiency on the side farther away from the fans. It should be mentioned here that the operating conditions (such as static pressure, flow velocity and the like) of the fans 140A and 140B in this embodiment tend to be consistent, and the condition difference is maintained within plus/minus 7% to 10%, so that the flows F1 and F2 are in the same state and easy to reach a balance.

More importantly, the flows with opposite directions and high static pressure conflict and squeeze in the channels 131, whereby the turbulent flows are formed at the flow field in the channels 131. This can increase the contact frequency and thermal contact area between the multiple pillars 132 of the first heat dissipation fin 130 and the turbulent flows, which is also equivalent to improving the heat exchange rate to the first heat dissipation fin 130. Then, the flows F3 and F4 that have completed the heat exchange may flow out from the third side S3 and the fourth side S4 which are not blocked by any components.

Please refer to FIG. 1 to FIG. 3 again. The circuit board 111 of this embodiment has an electrical connection pad 114 on the third side S3 for connecting with the expansion slot on the motherboard of the desktop computer when the graphics card 100 is disposed in the chassis of the desktop computer. Conventional graphics cards are equipped with axial fans, and the flow direction is mostly toward the board surface of the circuit board, in which the flow transmission is easily hindered due to the structure; in particular, when multiple graphics cards or multiple circuit boards are inserted on the motherboard of the desktop computer, it is more likely that heat is not easily dissipated since the structure blocks between these graphics cards or circuit boards. In contrast, in this embodiment, the fans 140A and 140B are disposed on the first side S1 and the second side S2, and in the end the flows F3 and F4 flow out from the third side S3 and the fourth side S4, this means that the flows F1, F2, F3, and F4 all travel parallel to the board surface of the circuit board 111, so the above-described blockage can be avoided.

Figure 4:
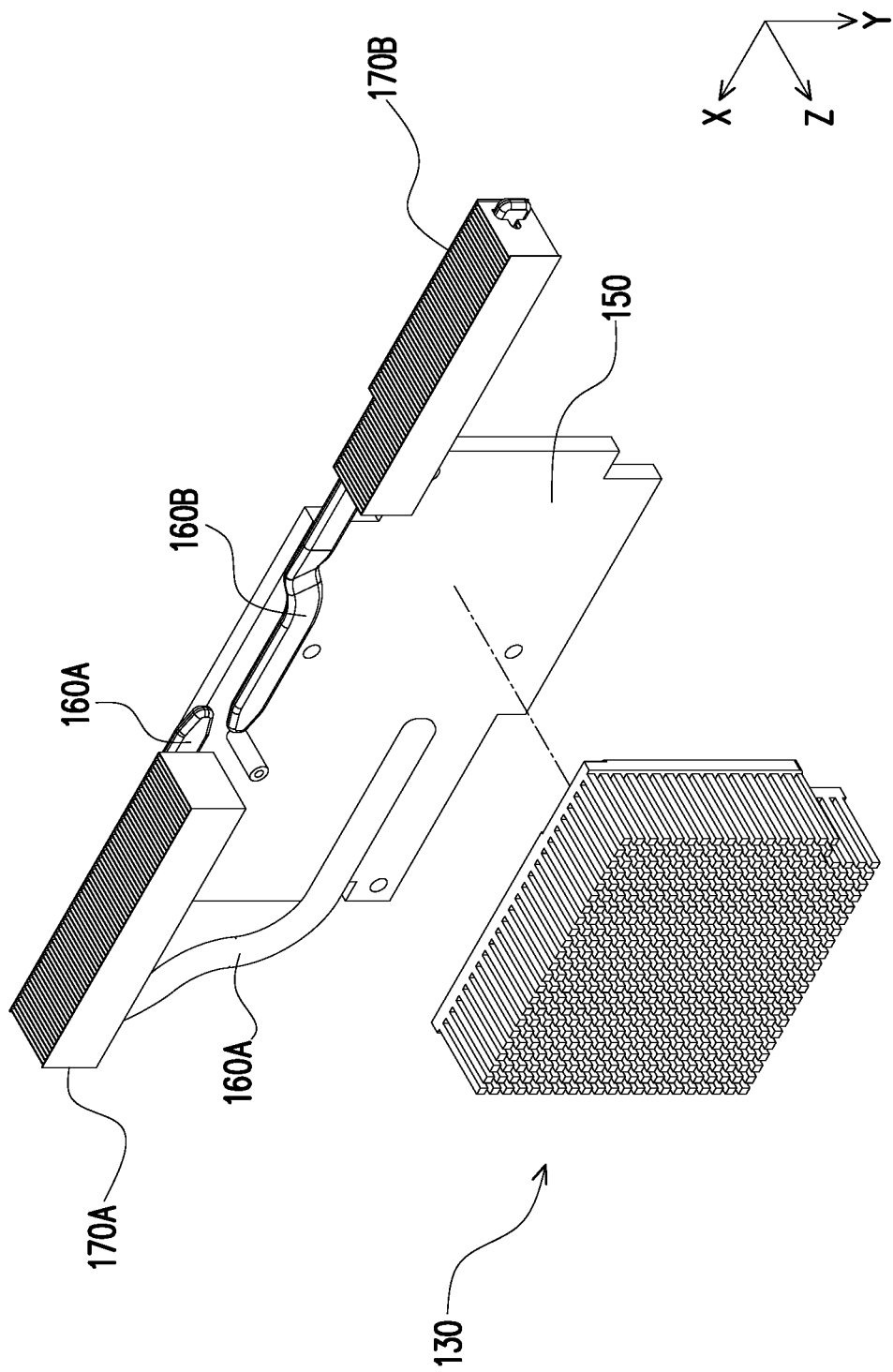
FIG. 4 is a disassembly schematic view of some components of FIG. 2.
Figure 5:
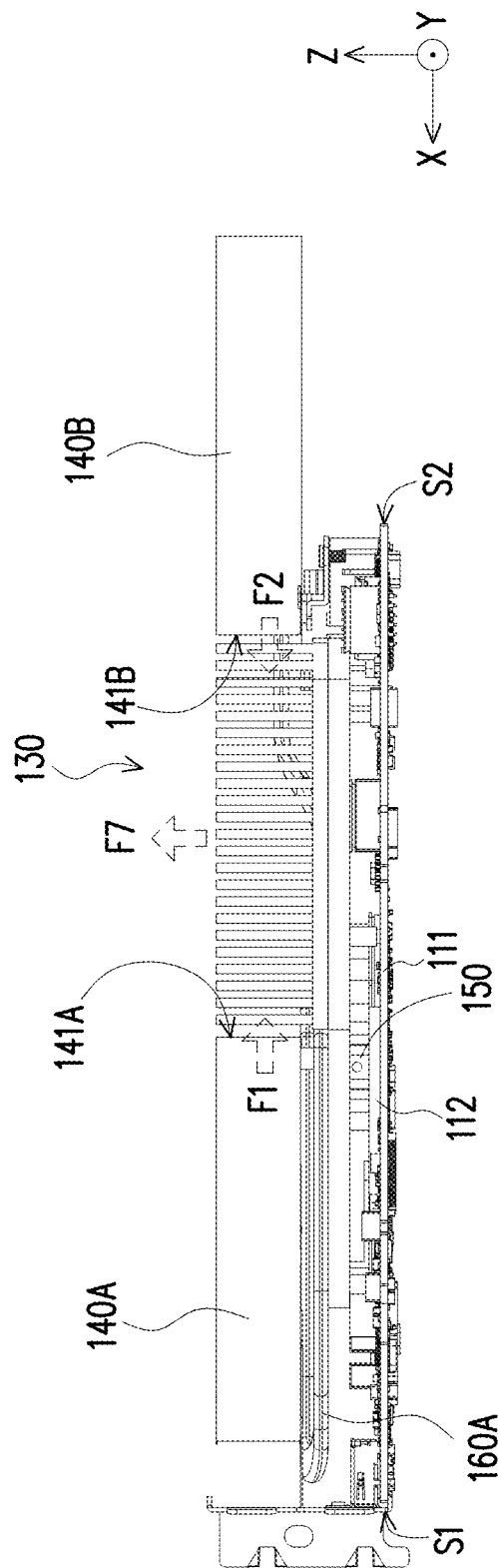
FIG. 5 is a side view of the graphics card of FIG. 1.

FIG. 4 is a disassembly schematic view of some components of FIG. 2. FIG. 5 is a side view of the graphics card of FIG. 1. Please refer to FIG. 4 and FIG. 5 together. The graphics card 100 of this embodiment further includes a heat diffusion member 150, such as a heat diffusion plate or an evaporator. The heat diffusion member 150 is disposed in contact between the heat source 112 and the first heat dissipation fin 130, and the orthographic projection of the first heat dissipation fin 130 on the heat diffusion member 150 is located within the range of the heat diffusion member 150. Accordingly, the heat diffusion member 150 performs heat transfer through the heat conduction of the heat diffusion plate or the two-phase flow of the evaporator, to efficiently transmit the heat generated by the heat source 112 to the first heat dissipation fin 130, so that heat would not be accumulated due to the large area difference between the heat source 112 and the first heat dissipation fin 130.

Furthermore, please refer to FIG. 3 and FIG. 5 again. The circuit board 111 of this embodiment further has a fifth side located in the normal direction of the circuit board 111. The flows F1 and F2 flow to the first heat dissipation fin 130, and after meeting and squeezing in the channels 131 to form turbulent flows, they also form a flow F7 to flow out of the graphics card 100 from the fifth side. In other words, for the graphics card 100 and the first heat dissipation fin 130 of this embodiment, the third side S3, the fourth side S4 and the fifth side may all serve as the outlets of the turbulent flows, and the flow F3, F4 and F7 may be formed as described above.

In addition, please refer to FIG. 2 to FIG. 4 again. The graphics card 100 of this embodiment further includes multiple heat pipes 160A and 160B and multiple second heat dissipation fins 170A and 170B. The fans 140A and 140B further includes second flow outlets 142A and 142B, respectively, which face the fourth side S4. The second heat dissipation fins 170A and 170B are disposed at the second flow outlets 142A and 142B. The heat pipes 160A and 160B are in thermal contact between the heat source 112 and the second heat dissipation fins 170A and 170B, respectively. The heat pipes 160A and 160B of this embodiment have structures that substantially abut between the heat diffusion member 150 and the second heat dissipation fins 170A and 170B. In short, the fans 140A and 140B of this embodiment have two flow outlets, and at the same time, the heat pipes 160A and 160B and the second heat dissipation fins 170A and 170B are combined to provide additional heat dissipation paths for the graphics card 100; that is, in addition to the above-described flows F1 to F4, flows F5 and F6 may be further provided to increase the heat dissipation efficiency.

Figure 6:
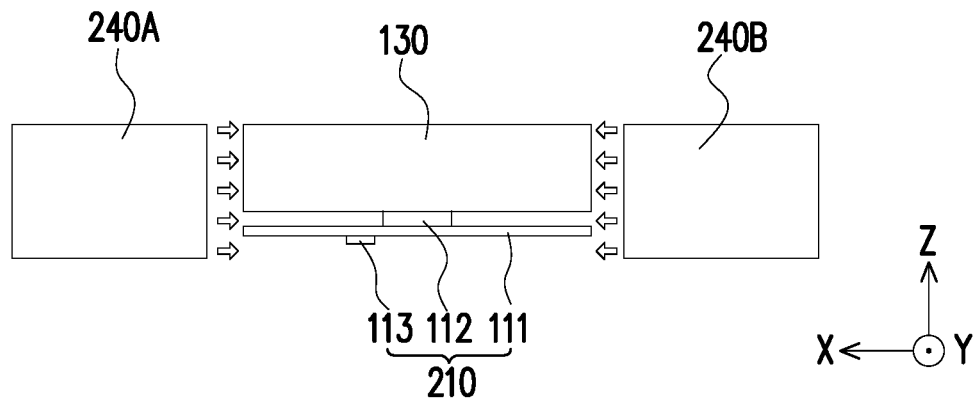
FIGS. 6 and 7 are simple schematic views respectively showing graphics cards with different configuration conditions.
Figure 7:
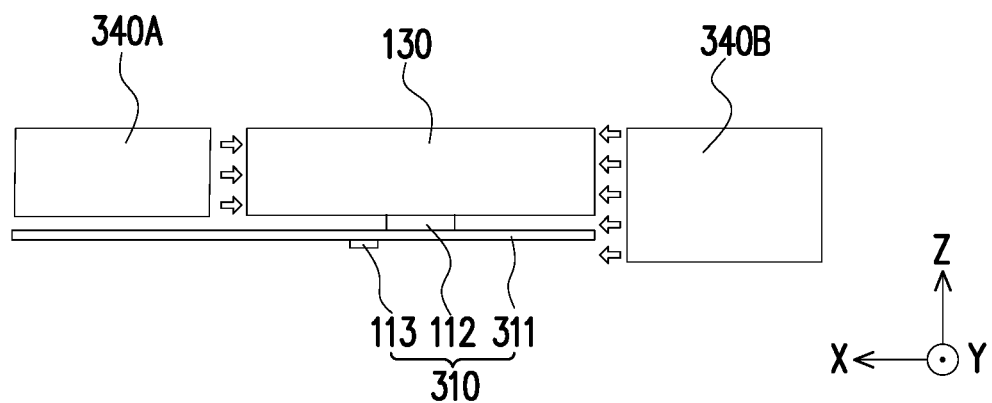

FIGS. 6 and 7 are simple schematic views respectively showing graphics cards with different configuration conditions. Please refer to FIG. 6 first and compare with FIG. 5. A circuit board module 210 of this embodiment includes a circuit board 111 and heat sources 112 and 113 disposed on two opposite surfaces of the circuit board 111. The heat source 112 is, for example, a GPU as described above, and the heat source 113 is a memory or other electronic components that generate heat in the circuit board module. The flows F1 and F2 generated by the fans 140A and 140B shown in FIG. 5 are directed to the first heat dissipation fin 130. In contrast, in the fans 240A and 240B of the embodiment shown in FIG. 6, the radial flow outlets (corresponding to the first flow outlets of the previous embodiment) substantially cover the first heat dissipation fin 130, the heat source 112, the circuit board 111 and the heat source 113. In addition to being formed in the channels of the first heat dissipation fin 130 (as in the previous embodiment), the turbulent flows as described above are also formed at the two opposite surfaces of the circuit board 111 to improve the heat dissipation efficiency. In addition, similarly, the flows also flow out of the graphics card from the third side S3 and the fourth side S4 of the circuit board 111 (same as the previous embodiment, not marked here).

Please refer to FIG. 7 first and compare with FIG. 5. Similarly, a circuit board module 310 of this embodiment includes a circuit board 311 and heat sources 112 and 113 disposed on two opposite surfaces of the circuit board 311. A fan 340A is similar to the above-described embodiment shown in FIG. 1 to FIG. 5, and a fan 340B is similar to the embodiment shown in FIG. 6, and the flows and effects generated by this embodiment are as described above, and will not be repeated here.

Figure 8:
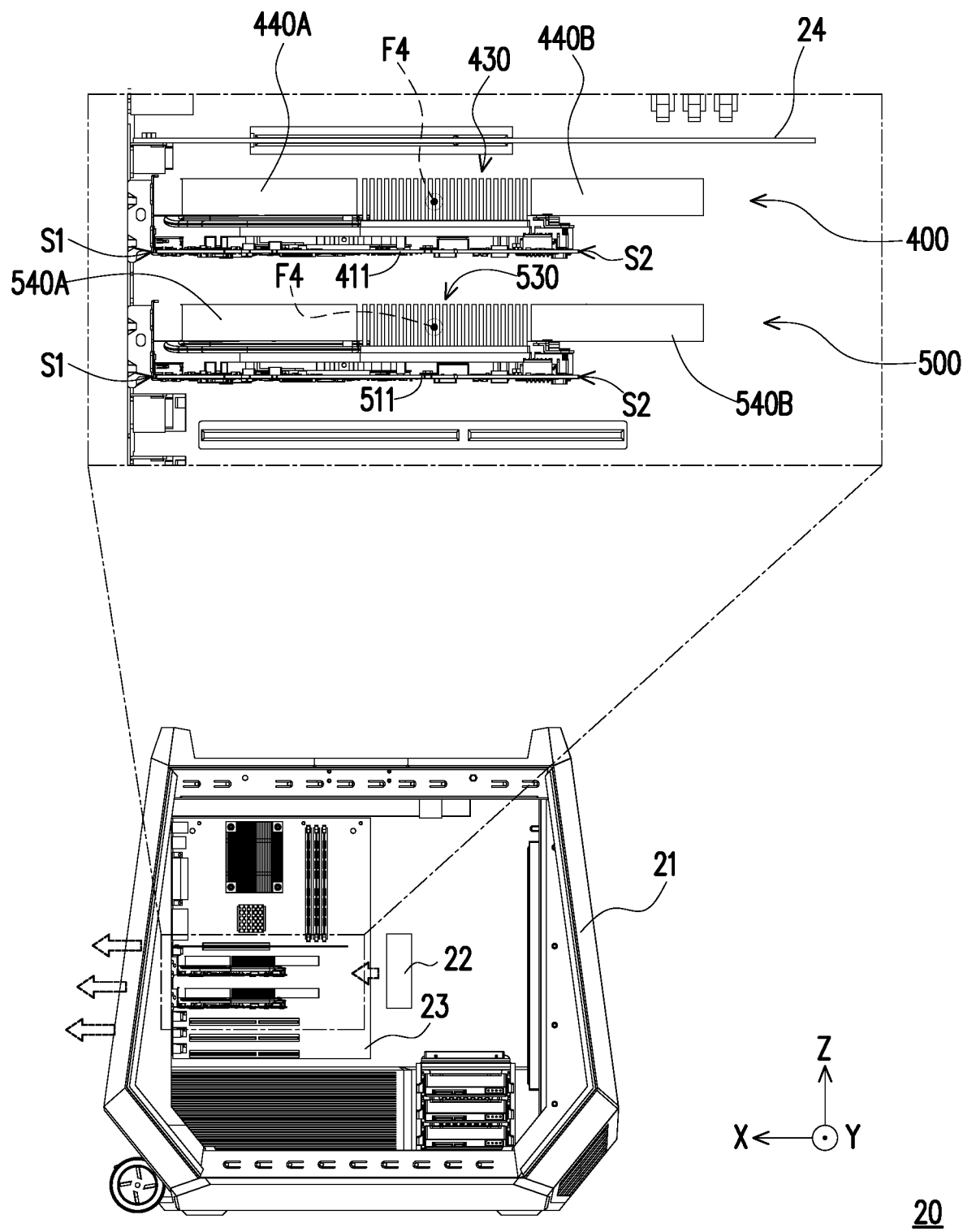
FIG. 8 is a simple schematic view of a computer host according to an embodiment of the disclosure.

FIG. 8 is a simple schematic view of a computer host according to an embodiment of the disclosure. Please refer to FIG. 8 and compare with FIG. 3. In this embodiment, a computer host 20 includes a body 21, a motherboard 23, a first graphics card 400, a second graphics card 500 and an electronic card 24. The first graphics card 400 of this embodiment includes a circuit board 411, a fan 440A, a fan 440B, and a first heat dissipation fin 430. The fan 440A is located on the first side S1, and the fan 440B is located on the second side S2. The second graphics card 500 includes a circuit board 511, a fan 540A, a fan 540B, and a first heat dissipation fin 530. The fan 540A is located on the first side S1, and the fan 540B is located on the second side S2. The components of the first graphics card 400 and the second graphics card 500 are the same as those of the graphics card 100 of the embodiment shown in FIG. 3, and are not described here again.

Furthermore, the electronic card 24, the graphics card 400 and the graphics card 500 in this embodiment are inserted on the motherboard 23 side by side with each other (and parallel to each other), and the first graphics card 400 is located between the electronic card member 24 and the second graphics card 500. Accordingly, when the above-described flow characteristics of the graphics card 100 are applied to the operating environment of the computer host 20 shown in FIG. 8, it can be further known that the third side of the first graphics card 400 is inserted on the motherboard 23, and that the third side of the second graphics card 500 is also inserted on the motherboard 23. More importantly, for the first graphics card 400, the electronic card 24 is blocking precisely the extending direction of the first heat dissipation fin 430, which is equivalent to blocking in the normal direction of the circuit board 411 (and especially the positive Z-axis direction); for the second graphics card 500, the first graphics card 400 is blocking precisely the extending direction of the first heat dissipation fin 530, which is equivalent to blocking in the normal direction of the circuit board 511 (and especially the positive Z-axis direction).

As a result, for the first graphics card 400, when the fan 440A and the fan 440B generate flows that meet and squeeze in the channels of the first heat dissipation fin 430 and form turbulent flows, the existence of the electronic card 24 prevents the flows from flowing out in the positive Z-axis direction, and there is also a blocking effect at the third side due to the existence of the motherboard 23. Therefore, in the end, the flow F4 flows out of the first graphics card 400 from the fourth side, that is, the positive Y-axis direction shown in the figure. Similarly, for the second graphics card 500, due to the existence of the fourth graphics card 400 and the motherboard 23, in the end, the flow F4 also flows out of the second graphics card 500 in the positive Y-axis direction. In another embodiment, the electronic card 24 may be another graphics card or other components or structures in the body 21.

In addition, the computer host 20 of this embodiment further includes a fan 22, which is disposed in the body 21 and generates a flow to flow toward the motherboard 23. In this embodiment, the height of the fan 22 on the Y-axis is substantially higher than that of the first graphics card 400 and the second graphics card 500, so the flow F4 flowing out from the first graphics card 400 and the second graphics card 500 respectively will be smoothly brought out of the body 21 by the flow generated by the fan 22.

Figure 9:
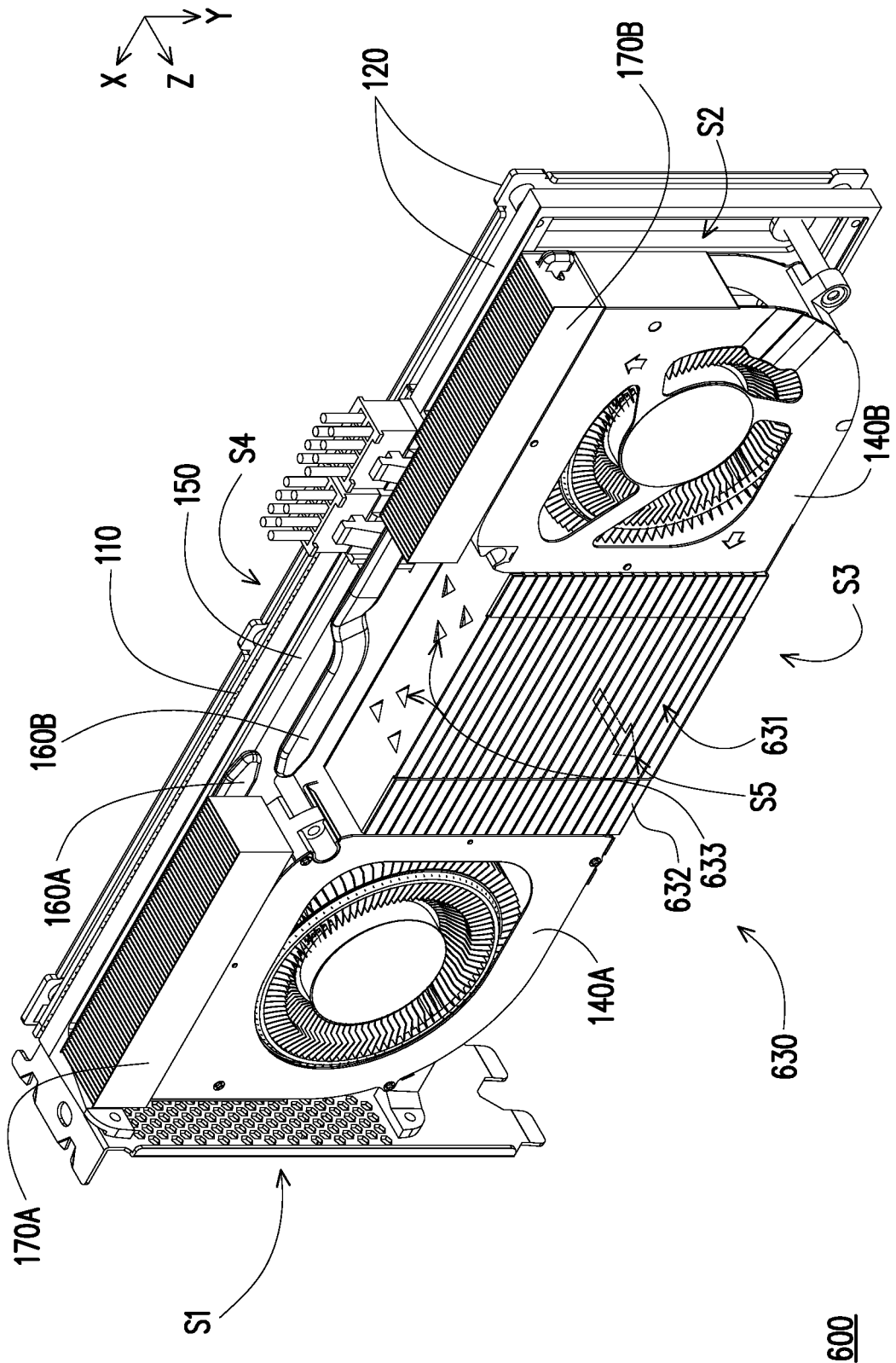
FIG. 9 is a schematic view of a graphics card according to another embodiment of the disclosure.

FIG. 9 is a schematic view of a graphics card according to another embodiment of the disclosure. Please refer to FIG. 9. The difference between a graphics card 600 of this embodiment and the previous embodiments lies in the first heat dissipation fin 630. Therefore, other similar parts are denoted by the same reference numerals, and the first side S1, the second side S2, the third side S3 and the fourth side S4 are also marked in FIG. 9 for the convenience of description, and for their characteristics, reference may be made to the previous embodiments, which will not be described again. In this embodiment, the circuit board 110 further has a fifth side S5 located in the normal direction of the circuit board 110. The first heat dissipation fin 630 of the graphics card 600 includes multiple sheets, which are arranged side by side in parallel with each other between the first flow outlets (such as the first flow outlets 141A and 141B as described above) to communicate with the first side S1, the second side S2 and the fifth side S5. In other words, channels 631 formed by these sheets substantially communicate with the first side S1, the second side S2 and the fifth side S5. In addition, each sheet includes at least one opening (exemplified with multiple openings 633 in this embodiment), so that the first heat dissipation fin 630 communicates with the third side S3 and the fourth side S4 through the openings 633, whereby after the flows generated by the fans 140A and 140B are introduced into the first heat dissipation fin 630, they flow out of the graphics card 600 from the third side S3, the fourth side S4 and the fifth side S5.

Further, it can be clearly seen from FIG. 9 that the area of these openings 633 is smaller than the cross-sectional area of these channels 631, so when the flows introduced into the first heat dissipation fin 630 flows out of the graphics card 600, the flow rate of the flows through the fifth side S5 is greater than the flow rate of the flows through the openings 633. In short, the openings 633 in this embodiment are formed by press processing the sheets to form incomplete openings; that is, there are still partial structures connected to the openings 633, so these openings 633 are used as spoilers, and most of the flows flow out of the graphics card 600 from the fifth side S5.

In addition, as shown in FIG. 9, each sheet of the first heat dissipation fin 630 further includes a folded edge 632 to overlap another adjacent sheet. This ensures that the flows generated from the fans 140A and 140B can be smoothly introduced into the first heat dissipation fins 630 and are not easily lost at the first flow outlets 141A and 141B.

It should be noted that, whether it is the graphics card 100 shown in FIG. 1 to FIG. 5 or the graphics card 600 shown in FIG. 9, both can be assembled in the body 21 shown in FIG. 8 with proper configuration. The difference is that for the graphics card 600, attention should be paid to avoid another graphics card, another electronic card or the structure of the computer host 20 from blocking in the normal direction of the circuit board 110 (that is, the fifth side S5), so that the flows generated by the fans 140A and 140B and introduced to the first heat dissipation fin 630 can smoothly flow out of the graphics card 600.

To sum up, in the above-described embodiments of the disclosure, the graphics card includes the circuit board module, the heat dissipation fin and the pair of fans. The circuit board of the circuit board module has the first side, the second side, the third side and the fourth side surrounding the heat source. The fans are disposed on the first side and the second side, that is, on the opposite sides of the heat dissipation fin, and provide flows toward the heat dissipation fin respectively. The heat dissipation fin has multiple channels to communicate with the first side, the second side, the third side and the fourth side. Accordingly, the flows generated by the fans meet and squeeze in the channels to form turbulent flows, and then flow out of the graphics card from the third side and the fourth side respectively.

A graphics card is suitable for being disposed in the chassis of the desktop computer and connected to the motherboard. When multiple graphics cards or circuit boards are disposed on the motherboard to form a layered structure, if the conventional axial fan is still used, it is obvious that heat dissipation will be difficult due to structural obstruction.

Accordingly, the heat dissipation fin is provided with centrifugal fans on two opposite sides. In addition to shortening the heat transfer and heat dissipation paths, and because of the flow direction of the centrifugal fans being parallel to the board surface of the circuit board, the centrifugal fans can effectively solve the problems that may be faced by the above-described configuration on the motherboard. More importantly, the dual flows generated by the dual fans can conflict to form the turbulent flows in the channels or on the surface of the circuit board, which increases the contact frequency between the flows and the heat dissipation fin, thereby improving the heat dissipation efficiency.

What is claimed is:

1. A graphics card comprising:
a circuit board module comprising a circuit board and at least one heat source, wherein the heat source is disposed on the circuit board, and the circuit board has a first side, a third side, a second side and a fourth side surrounding the heat source in sequence, wherein the first side and the second side are opposite to each other, and the third side and the fourth side are opposite to each other;
a first heat dissipation fin in thermal contact with the heat source, wherein the first heat dissipation fin has a plurality of channels communicating with the first side, the second side, the third side and the fourth side; and
a pair of fans disposed beside the heat source and located on the first side and the second side respectively, wherein the pair of fans each has a first flow outlet facing the first heat dissipation fin to generate flows flowing toward the first heat dissipation fin.

2. The graphics card according to claim 1, wherein the pair of fans are each a centrifugal fan.

3. The graphics card according to claim 1, wherein the flows meet and squeeze in the channels to form turbulent flows and then flow out of the graphics card through the third side and the fourth side respectively.

4. The graphics card according to claim 1, wherein each of the fans further comprises a second flow outlet facing the third side or the fourth side.

5. The graphics card according to claim 4, further comprising a plurality of heat pipes and a plurality of second heat dissipation fins, the second heat dissipation fins are disposed at the second flow outlets, and the heat pipes are in thermal contact between the heat source and the second heat dissipation fins respectively.

6. The graphics card according to claim 5, further comprising a heat diffusion member whose structure abuts against the first heat dissipation fin, and the heat pipes abut between the heat diffusion member and the second heat dissipation fins respectively.

7. The graphics card according to claim 4, further comprising a heat diffusion member and a plurality of second heat dissipation fins, the second heat dissipation fins are disposed at the second flow outlets, and the heat diffusion member is in thermal contact between the heat source and the second heat dissipation fins.

8. The graphics card according to claim 1, wherein the first heat dissipation fin comprises a plurality of pillars arranged in a matrix, and spacings between the pillars form the channels.

9. The graphics card according to claim 1, further comprising a heat diffusion member whose structure abuts between the heat source and the first heat dissipation fin, and an orthographic projection of the first heat dissipation fin on the heat diffusion member is located within a range of the heat diffusion member.

10. The graphics card according to claim 1, wherein at least one of the first flow outlets covers the first heat dissipation fin, the heat source and the circuit board.

11. The graphics card according to claim 1, wherein the circuit board further comprises an additional heat source, the heat source and the additional heat source are located on two opposite surfaces of the circuit board, and at least one of the first flow outlets covers the first heat dissipation fin, the heat source, the additional heat source and the circuit board.

12. The graphics card according to claim 1, wherein the graphics card is configured to be disposed in a chassis of a desktop computer to connect to a motherboard of the desktop computer, and the circuit board has an electrical connection pad configured to be connected to the motherboard and located on the third side or the fourth side.

13. The graphics card according to claim 1, wherein the circuit board further comprises a fifth side located in a normal direction of the circuit board, and the flows meet and squeeze in the channels to form turbulent flows and then flow out of the graphics card through the third side, the fourth side and the fifth side respectively.

14. The graphics card according to claim 13, wherein the first heat dissipation fin comprises a plurality of sheets, the sheets are arranged side by side in parallel with each other between the first flow outlets to communicate with the first side, the second side and the fifth side.

15. The graphics card according to claim 14, wherein each of the sheets comprises at least one opening, the first heat dissipation fin communicates with the third side and the fourth side through the openings, and a flow rate of the flows through the fifth side is greater than a flow rate of the flows through the openings.

16. A computer host comprising:
a body;
a motherboard disposed in the body; and
at least one graphics card inserted on the motherboard, wherein the graphics card comprises:
a circuit board module comprising a circuit board and at least one heat source, wherein the heat source is disposed on the circuit board, and the circuit board has a first side, a third side, a second side and a fourth side surrounding the heat source in sequence, wherein the first side and the second side are opposite to each other, and the third side and the fourth side are opposite to each other;
a first heat dissipation fin in thermal contact with the heat source, wherein the first heat dissipation fin has a plurality of channels communicating with the first side, the second side, the third side and the fourth side; and
a pair of fans disposed beside the heat source and located on the first side and the second side respectively, wherein the pair of fans each has a first flow outlet facing the first heat dissipation fin to generate flows flowing toward the first heat dissipation fin.

17. The computer host according to claim 16, further comprising an electronic card inserted on the motherboard and side by side with the graphics card, wherein the electronic card is located beside the first heat dissipation fin, the motherboard is located on the third side, the flows meet and squeeze in the channels to form turbulent flows and then flow out of the graphics card from the fourth side.

18. The computer host according to claim 16, further comprising a first graphics card and a second graphics card inserted on the motherboard side by side with each other, wherein the first graphics card is located beside the first heat dissipation fin of the second graphics card, the motherboard is located on the third side of the first graphics card and the third side of the second graphics card, and in the second graphics card, the flows meet and squeeze in the channels to form turbulent flows and then flow out of the second graphics card from the fourth side.

19. The computer host according to claim 16, wherein the pair of fans are each a centrifugal fan.

20. The computer host according to claim 16, wherein each of the fans further comprises a second flow outlet facing the fourth side.

21. The computer host according to claim 20, wherein the graphics card further comprises a plurality of heat pipes and a plurality of second heat dissipation fins, the second heat dissipation fins are disposed at the second flow outlets, and the heat pipes are in thermal contact between the heat source and the second heat dissipation fins respectively.

22. The computer host according to claim 21, wherein the graphics card further comprises a heat diffusion member whose structure abuts against the first heat dissipation fin, and the heat pipes abut between the heat diffusion member and the second heat dissipation fins respectively.

23. The computer host according to claim 16, wherein the first heat dissipation fin comprises a plurality of pillars arranged in a matrix, and spacings between the pillars form the channels.

24. The computer host according to claim 16, wherein the circuit board further comprises a fifth side located in a normal direction of the circuit board, and the flows meet and squeeze in the channels to form turbulent flows and then flow out of the graphics card through the third side, the fourth side and the fifth side respectively.

25. The computer host according to claim 24, wherein the first heat dissipation fin comprises a plurality of sheets, the sheets are arranged side by side in parallel with each other between the first flow outlets to communicate with the first side, the second side and the fifth side.

26. The computer host according to claim 25, wherein each of the sheets comprises at least one opening, the first heat dissipation fin communicates with the third side and the fourth side through the openings, and a flow rate of the flows through the fifth side is greater than a flow rate of the flows through the openings.

* * * * *